(12) United States Patent
Tsuzuki et al.

(10) Patent No.: US 9,297,977 B2
(45) Date of Patent: Mar. 29, 2016

(54) LENS OPTICAL COMPONENT WITH LENS HOUSING SUPPORTED BY LENS HOLDER

(71) Applicants: NIPPON TELEGRAPH AND TELEPHONE CORPORATION, Tokyo (JP); NTT ELECTRONICS CORPORATION, Yokohama-shi, Kanagawa (JP)

(72) Inventors: Ken Tsuzuki, Atsugi (JP); Toshiki Nishizawa, Yokohama (JP); Yuji Mitsuhashi, Yokohama (JP)

(73) Assignees: Nippon Telegraph and Telephone Corporation, Tokyo (JP); NTT Electronics Corporation, Kanagawa (JP)

(*) Notice: Subject to any disclaimer, the term of this patent is extended or adjusted under 35 U.S.C. 154(b) by 0 days.

(21) Appl. No.: 14/411,860

(22) PCT Filed: Jul. 1, 2013

(86) PCT No.: PCT/JP2013/004080
§ 371 (c)(1),
(2) Date: Dec. 29, 2014

(87) PCT Pub. No.: WO2014/006875
PCT Pub. Date: Jan. 9, 2014

(65) Prior Publication Data
US 2015/0177474 A1 Jun. 25, 2015

(30) Foreign Application Priority Data
Jul. 3, 2012 (JP) ................................ 2012-149507

(51) Int. Cl.
*G02B 6/42* (2006.01)
*G02B 7/02* (2006.01)
(Continued)

(52) U.S. Cl.
CPC . *G02B 7/02* (2013.01); *B23K 26/20* (2013.01); *B23K 26/21* (2015.10); *B23K 33/00* (2013.01);
(Continued)

(58) Field of Classification Search
CPC .. G02B 6/4204; G02B 6/4237; G02B 6/4244; G02B 6/4212; H01L 31/0232; H01L 31/02325; H01S 5/02288; H01S 5/022; B23K 26/20
USPC .......................... 385/33–37, 41, 147; 359/811
See application file for complete search history.

(56) References Cited

U.S. PATENT DOCUMENTS

| 5,793,540 A | 8/1998 | Ohtsuki et al. |
| 2002/0012370 A1 | 1/2002 | Ishimaru |

(Continued)

FOREIGN PATENT DOCUMENTS

| CN | 203385921 | 1/2014 |
| JP | H05-329673 | 12/1993 |

(Continued)

OTHER PUBLICATIONS

International Search Report in corresponding PCT Application No. PCT/JP2013/004080 dated Jul. 30, 2013.

(Continued)

*Primary Examiner* — Akm Eanyet Ullah
(74) *Attorney, Agent, or Firm* — Workman Nyedegger

(57) ABSTRACT

A lens holder includes a pair of leg members inclined and extending to a lens housing from a support member that supports the lens holder at a predetermined position. A distance between pair of leg members is set such that the distance between lower end portions is equal to or larger than a width of the lens housing to be supported, and the distance between upper end portions is equal to or smaller than the width of the lens housing to be supported, and that the distance becomes gradually smaller from the lower end portions to the upper end portions of the legs. A lens optical component includes a lens housing holding a lens, and the lens holder.

14 Claims, 14 Drawing Sheets

(51) Int. Cl.
*H01L 31/0232* (2014.01)
*B23K 26/20* (2014.01)
*B23K 33/00* (2006.01)
*H01S 5/022* (2006.01)

(52) U.S. Cl.
CPC ............ *G02B 6/4204* (2013.01); *G02B 6/4212* (2013.01); *G02B 6/4237* (2013.01); *G02B 6/4244* (2013.01); *H01L 31/02325* (2013.01); *H01S 5/022* (2013.01); *H01S 5/02288* (2013.01)

(56) References Cited

U.S. PATENT DOCUMENTS

| | | |
|---|---|---|
| 2002/0021875 A1 | 2/2002 | Tateno et al. |
| 2002/0039373 A1 | 4/2002 | Ishimaru |
| 2004/0085684 A1 | 5/2004 | Basra et al. |
| 2015/0177474 A1 | 6/2015 | Tsuzuki et al. |

FOREIGN PATENT DOCUMENTS

| | | |
|---|---|---|
| JP | H06-201921 | 7/1994 |
| JP | H08-005876 | 1/1996 |
| JP | H09-043454 | 2/1997 |
| JP | 2000-277843 | 10/2000 |
| JP | 2001-111155 | 4/2001 |
| JP | 2002-014257 | 1/2002 |
| JP | 2002-107586 | 4/2002 |
| JP | 2009-075343 | 4/2009 |

OTHER PUBLICATIONS

International Preliminary Report on Patentability and Written Opinion in corresponding application No. PCT/JP2013/004080 dated Jan. 6, 2015.

Chinese Office Action (English Translation) for Application No. 201310271802.1, dated Sep. 7, 2015.

LENS OPTICAL COMPONENT WITH LENS HOUSING SUPPORTED BY LENS HOLDER

TECHNICAL FIELD

The present invention relates to an optical module used for optical fiber communications, and more specifically relates to a lens optical component having a structure in which a lens housing holding a lens is supported by a lens holder, and to an optical module equipped with a lens optical component.

BACKGROUND ART

Optical fiber communications use an optical module in which optical devices such as a laser, a photodiode, and an optical waveguide, and an optical fiber for transmitting information are optically coupled to each other. For such an optical module, it is important to establish efficient optical coupling between optical devices and between an optical device and an optical fiber and to keep the coupling stable with low possibility of aging variation. As lens optical components each configured by optically aligning a lens, a lens housing and a lens holder for establishing an optical coupling, there have been known a lens optical component illustrated in FIGS. 1A to 1C (Patent Literature 1), for example.

As illustrated in FIG. 1A, a lens optical component 15 has a structure in which a lens housing 2 holding a lens 1 is supported by a lens holder 10. The lens holder 10 has a structure in which a pair of side plates 11 are disposed vertical to one surface of a flat-plate-shaped support member 12 and arranged in parallel. In order that the pair of side plates 11 can support the lens housing 2 from both sides, a distance between the pair of side plates 11 is set to be slightly smaller than or equal to a width W of the lens housing 2. Moreover, this lens optical component 15 is incorporated in a package in such a way that the lens housing 2 and the lens holder 10 are fixedly welded to each other at points 11a, 11b, and the lens holder 10 is fixedly welded to a not-illustrated device carrier at points 12a, 12b of the support member 12. For the welding, YAG laser welding is employed.

CITATION LIST

Patent Literature

PTL 1: Japanese Patent Laid-Open No. H05-329673

If the lens holder 10 is fabricated with low fabrication accuracy, however, the distance between the pair of side plates 11 does not fit to the width W of the lens housing 2 in some cases. For example, if the distance between the pair of side plates 11 is smaller than the width W of the lens housing 2, the lens holder 10 is deformed when holding the lens housing 2 from both sides, and accordingly tip ends of the side plates 11 are opened to have a wider distance than the width W of the lens housing 2 as illustrated in FIG. 1B. This may be a cause of misalignment in welding or poor welding. On the other hand, if the distance between the pair of side plates 11 is larger than the width W of the lens housing 2, as illustrated in FIG. 1C, the lens holder 10 cannot support the lens housing 2 because a gap is formed between the lens housing 2 and the side plates 11.

In addition, a lens optical component 16 including a lens holder illustrated in FIG. 2 has been also known (Patent Literature 2). In this lens optical component 16, side plates 13 of a lens holder 14 are each formed in a curved shape, and the lens holder 14 supports the lens housing 2 from both sides by use of elastic deformation of the curved side plates 13. However, points 13a, 13b where the lens housing 2 and the side plates 13 of the lens holder 14 are to be welded are located at curved portions of the side plates 13, in other words, hidden portions of the side plates 13, it is not easy to position the points 13a, 13b correctly on contact surfaces between the lens housing 2 and the side plates 13. If the points 13a, 13b are not positioned correctly, there occurs a problem such as misalignment of a lens in welding.

To solve the foregoing problems, an invention according to one embodiment is a lens holder that supports a lens housing holding a lens at a predetermined position, the lens holder including: a support member that supports the lens holder at a predetermined position; and a pair of leg members that are inclined and extend from the support member toward the lens housing. The pair of leg members are formed with a distance between the pair of leg members set such that the distance between lower end portions thereof joined to the support member is equal to or larger than a width of the lens housing to be supported and the distance between upper end portions thereof is set to be equal to or smaller than the width of the lens housing to be supported, and that the distance becomes gradually smaller from the lower end portions to the upper end portions.

An invention according to another embodiment is the lens holder according to above embodiment, in which a bump formed at a start point or an end point of wire cutting performed in fabricating the lens holder is formed on an outer side surface of any of the leg members.

An invention according to another embodiment is a lens optical component including: a lens housing holding a lens; and the lens holder according to above embodiment. The upper end portions of the pair of leg members are in contact with the lens housing, and the pair of leg members are welded at positions in contact with the lens housing.

An invention according to another embodiment is the lens optical component according to above embodiment, in which the positions where the lens housing is welded to the lens holder are located at the same height as an optical center of the lens.

An invention according to another embodiment is the lens optical component according to above embodiment, in which the positions where the lens housing and the leg members are in contact with each other are located at the same height as an optical center of the lens.

An invention according to another embodiment is a package equipped with a lens optical component, the package including: the lens optical component according to above embodiment; and two or more optical components. The lens optical component is inserted in an optical path of the two or more optical components, and the height of the lens holder is set to be equal to a height of the input-output portion of an optical device.

An invention according to another embodiment is the package equipped with a lens optical component according to claim 6, in which the lens holder of the lens optical component is made of a material having the same thermal expansion coefficient as that of a device carrier on which the lens holder is to be mounted.

DESCRIPTION OF EMBODIMENTS

Hereinafter, embodiments of the present invention are described in details.

Figure 1A:
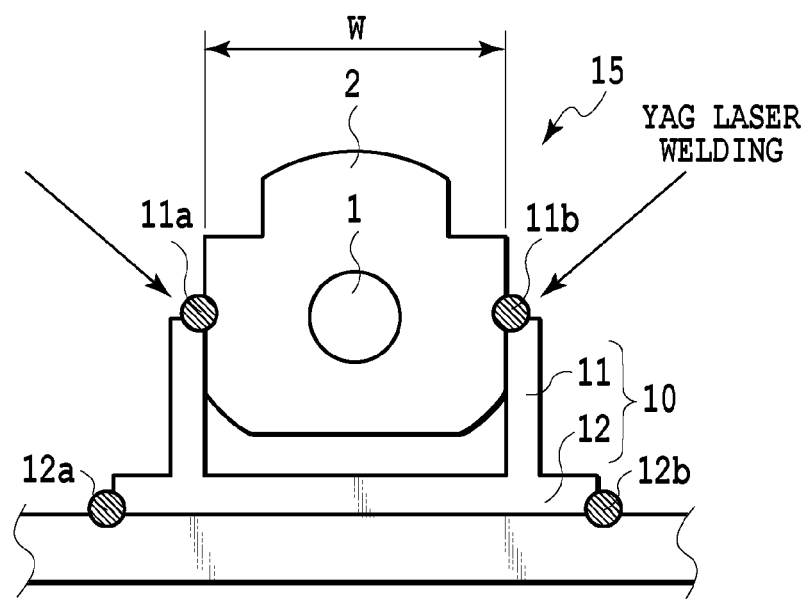
FIG. 1A is a view illustrating an example of a structure of a conventional lens optical component.
Figure 1B:
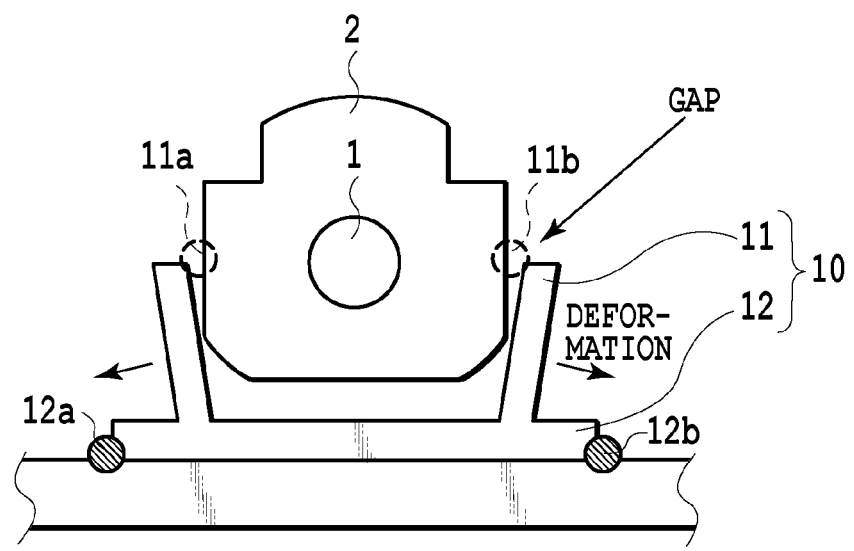
FIG. 1B is a view illustrating the example of the structure of the conventional lens optical component.
Figure 1C:
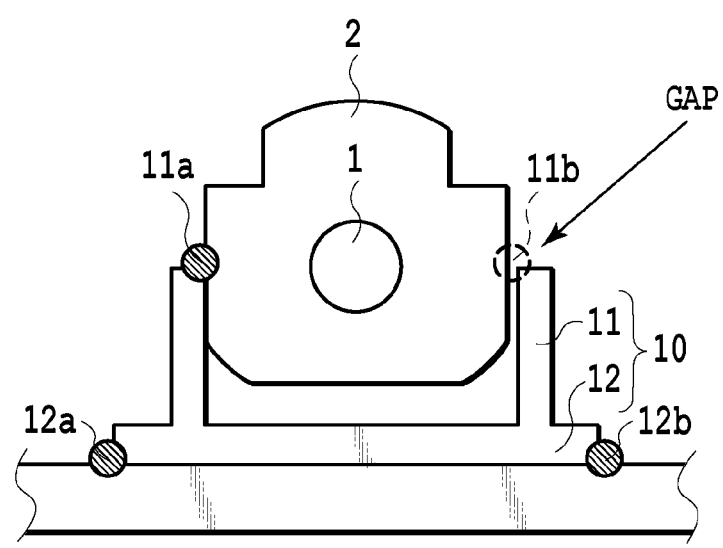
FIG. 1C is a view illustrating the example of the structure of the conventional lens optical component.
Figure 2:
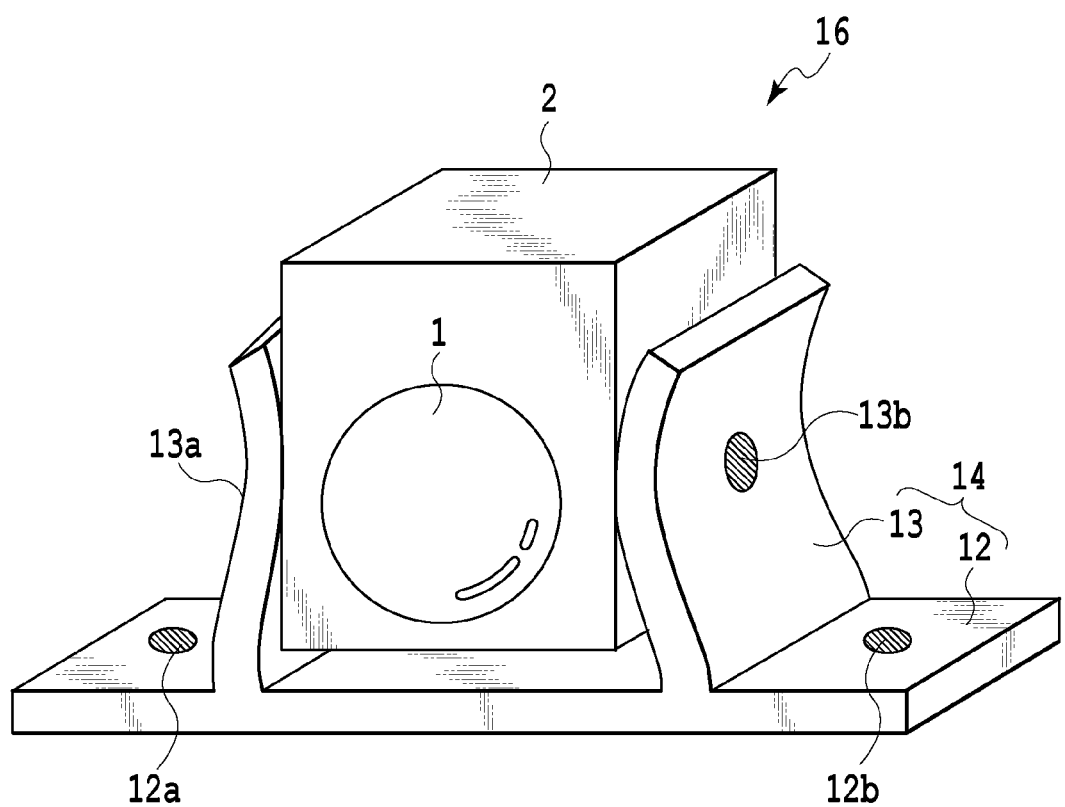
FIG. 2 is a diagram illustrating another example of a structure of a conventional lens optical component.
Figure 3A:
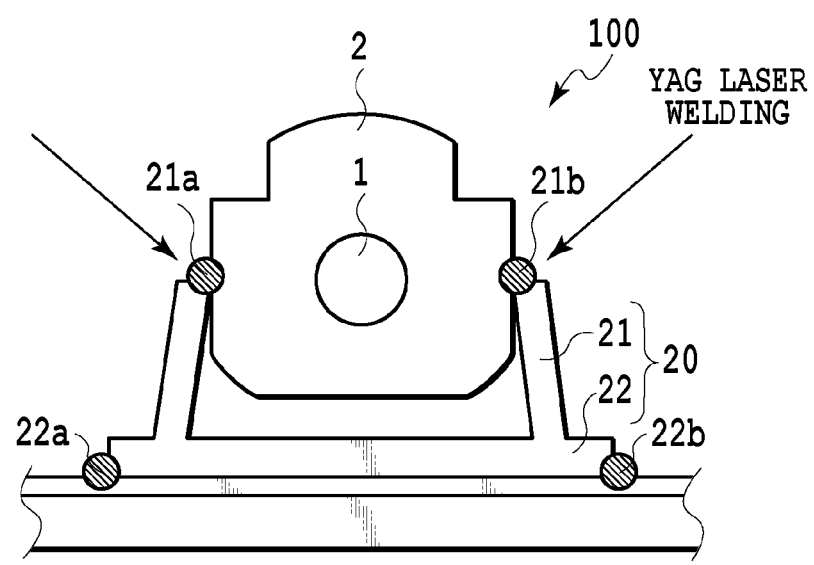
FIG. 3A is a front view illustrating a schematic structure of a lens optical component according to the present invention.
Figure 3B:
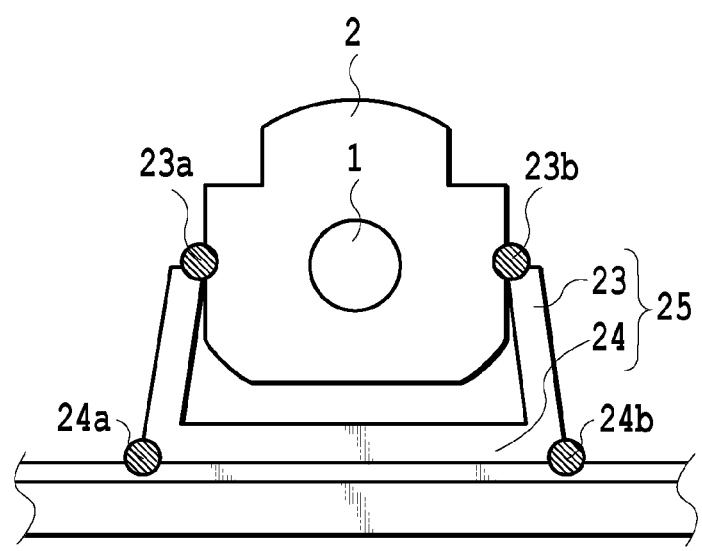
FIG. 3B is a front view illustrating a schematic structure of a lens optical component according to the present invention.

FIGS. 3A and 3B are front views illustrating schematic structures of a lens optical component of the present invention. In FIG. 3A, a lens optical component 100 includes a lens 1, a lens housing 2 holding the lens 1, and a lens holder 20 supporting the lens housing 2. The lens holder 20 includes a support section 22 and a pair of side plates (also called legs) 21 inclined while extending from the support section 22 to the lens housing 2.

The support section 22 is a member serving as a base for supporting the lens optical component 100 as a whole, and is made of a flat-plate-shaped metal member, for example. The support section 22 is fixedly welded at weld portions 22a, 22b to a carrier where the lens optical component is to be mounted. Here, the weld portions 22a, 22b are located on both ends of the support section 22 in a width direction of the lens housing 2. For this welding, YAG laser welding, for example, is used, but another type of laser welding may be used. The support section 22 is not limited to a support section 22 in a protruding shape that has a larger length in the width direction of the lens housing 2 than a distance between the pair of side plates 21 as illustrated in FIG. 3A, but may be formed as a support section 24 in a shape that is as long as the distance between the pair of side plates 21 as illustrated in FIG. 3B. The support section longer than the distance between the pair of side plates 21 is preferable because the support section can prevent distortion of the lens holder 20.

The side plates 21 are a member for supporting the lens housing 2 from both sides, and are made of two flat-plate-shaped metal members forming a pair, for example. The pair of side plates 21 are provided in a manner joined to the support section 22. The side plates 21 may be formed integrally with the support member, or may be formed as separate members and be united with the support member by welding or the like. The pair of side plates 21 are set such that a distance between the side plates 21 becomes smallest at their upper ends. Specifically, as illustrated in FIGS. 3A and 3B, the pair of side plates 21 are provided to the support member 22 in such an inclined manner that an entrance of the side plates 21 from which the lens housing 2 is to be inserted is narrow while a bottom side thereof is wide. In addition, the narrowest distance between the pair of side plates 21 is set to approximately the same size as the width of the lens housing 2.

The lens housing 2 includes an opening through which light is inputted and outputted to and from the held lens 1. The lens housing 2 can be designed such that at least at a portion corresponding to the height range of the opening has a fixed width-wise (left-right in the drawings) dimension, and that the other portions are formed in any contour shapes. The lens housing 2 is formed in such a way that the periphery of a cylinder having approximately the same height as a thickness of the lens 1 is cut into a shape illustrated in FIGS. 3A and 3B, for example. The lens housing 2 is formed to have a width-wise dimension slightly larger than or equal to the distance between the upper end portions of the pair of side plates 21 of the lens holder 20. The lens housing 2 is inserted between and supported by the pair of side plates 21 of the lens holder 20 from both sides. Since the lens optical component 100 employs the structure in which the pair of side plates 21 of the lens holder 20, between which the distance becomes gradually narrower toward the tip ends, holds the lens housing 2 from both sides by their tip end portions, certain tolerance ranges can be allowed for the width of the lens housing 2 and the distance between the upper end portions of the pair of side plates 21 of the lens holder 20. Both the lens housing 2 and the lens holder 20 have very small dimensions, and therefore the manufacturing can be made easier if the tolerance ranges are allowed.

Figure 4A:
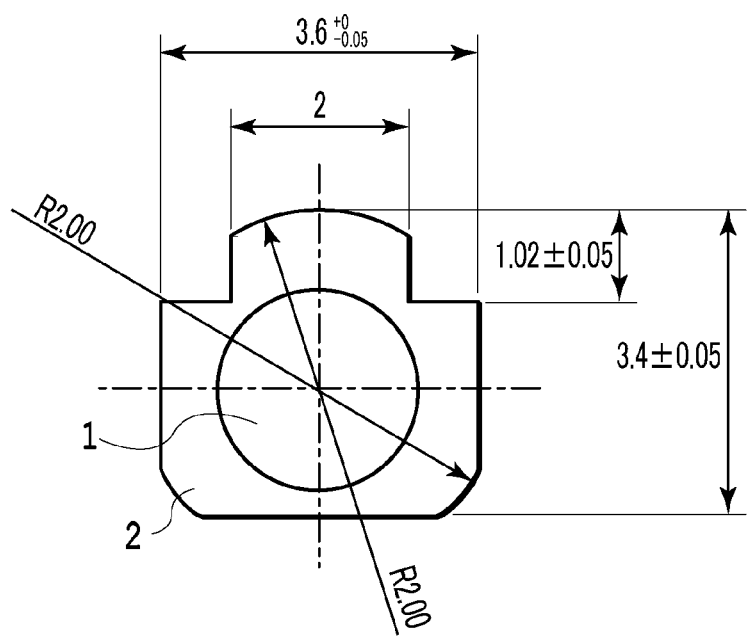
FIG. 4A is a diagram illustrating an example of dimensions of a lens housing.
Figure 4B:
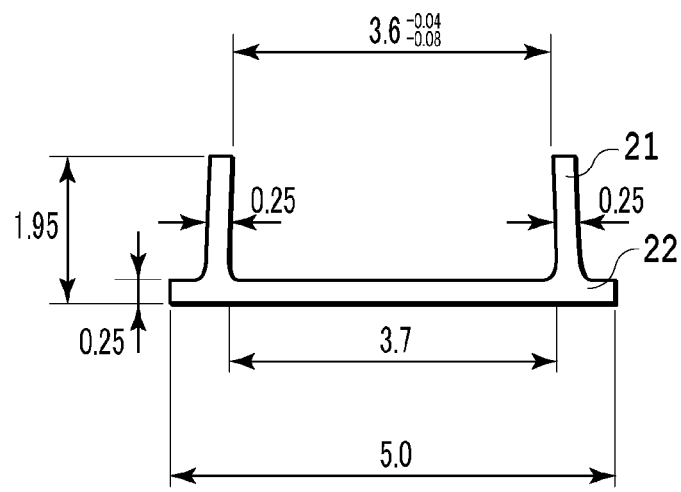
FIG. 4B is a diagram illustrating an example of dimensions of a lens holder.

Here, examples of dimensions of the lens housing 2 and the lens holder 20 are described by using FIGS. 4A and 4B. FIGS. 4A and 4B are diagrams illustrating examples of dimensions of portions of the lens optical component. FIG. 4A presents the example of dimensions of the lens housing 2, whereas FIG. 4B presents the example of dimensions of the lens holder 20. The lens housing 2 can be fabricated by cutting the periphery of a cylinder with φ 4 mm having an opening and being capable of inserting and holding the lens 1 therein. A protruding portion with a width of 2 mm formed in an upper portion of the lens housing is for use to clamp and move the lens housing 2 by a clamp or the like and therefore is preferably formed. The width of the lens housing 2 is 3.6 mm and has a tolerance in a range of +0 mm to −0.05 mm. The height of the lens housing 2 is 3.4 mm, and has a tolerance in a range of +0.05 mm to −0.05 mm.

The lens holder 20 has a material width of 0.25 mm, and has a height of 1.95 mm. The distance between the pair of side plates 21 is 3.6 mm at the upper end portions, and has a tolerance in a range of −0.08 mm to −0.04 mm. The distance is 3.7 mm at lower end portions joined to the support section 22. The support section 22 supporting the side plates 21 has a length of 5.0 mm. The lens housing 2 is formed to have curved bottom surfaces at both end portions in the width direction as illustrated in FIG. 4A. When the lens housing 2 is pushed into the lens holder 20 from the entrance to the bottom side, the lens housing 2 is inserted while pressing and spreading the pair of side plates 21 of the lens holder 20 outward, and the upper ends of the side plates 21 of the lens holder 20 come into close contact with side surfaces of the lens housing 2. Then, fixation without misalignment can be achieved by welding the upper ends of the side plates 21 of the lens holder 20.

Figure 5:
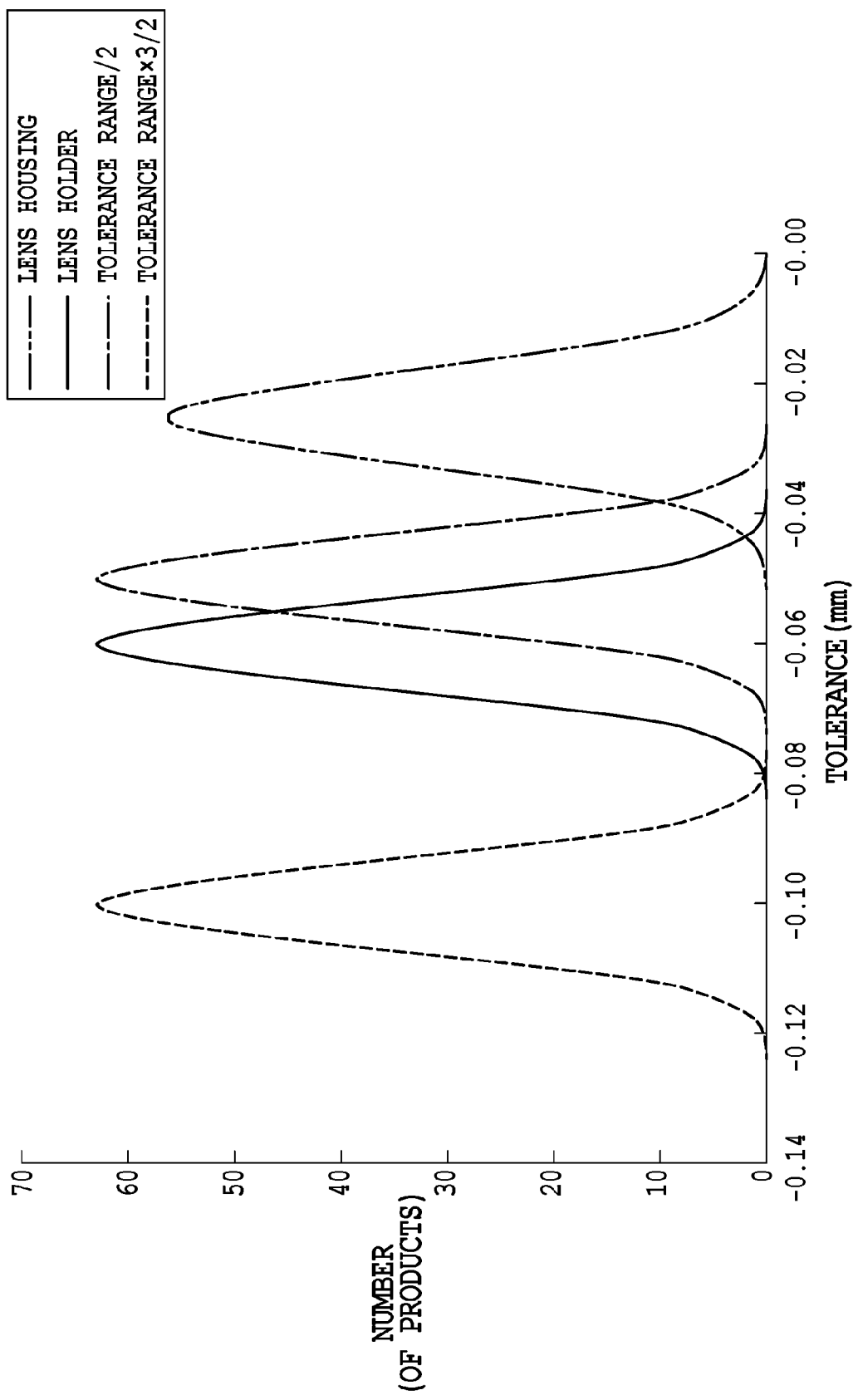
FIG. 5 is a diagram illustrating tolerances allowed for a lens housing and a lens holder.

FIG. 5 is a diagram illustrating manufacturing tolerances of the widths of the lens housing and the lens holder illustrated in FIGS. 4A and 4B. As product standards of the lens housing 2 and the lens holder 20 illustrated in FIGS. 4A and 4B, the tolerance range of +0 mm to −0.05 mm is set for the lens housing 2, and the tolerance range of −0.08 mm to −0.04 mm is set for the lens holder 20. For fabricating the lens optical component by using these lens housing 2 and lens holder 20, it is preferable that the tolerance center of the lens holder 20 be set smaller than a value obtained by subtracting (the tolerance range of the housing width)/2 from the tolerance center of the housing width, but larger than a value obtained by subtracting (the tolerance range of the housing width)×3/2 from the tolerance center of the housing width.

The reason why it is preferable that the tolerance center of the lens holder 20 be set smaller than the value obtained by subtracting (the tolerance range of the housing width)/2 from the tolerance center of the housing width is that a possibility that poor welding will occur can be made as low as 7% or below with respect to all products. In FIG. 5, at a portion where a tolerance distribution of the width of the lens housing and a tolerance distribution of the distance between the side plates of the lens holder overlap each other, the distance between the side plates of the lens holder is larger than the width of the lens housing, a gap is formed between the side plates 21 of the lens holder and the lens housing 2, and consequently poor welding may possibly occur. Hence, this overlap portion is set to cover 7% or less of all the products.

Then, the reason why it is preferable that the tolerance center of the lens holder 20 be set larger than the value obtained by subtracting (the tolerance range of the housing width)×3/2 from the tolerance center of the housing width is as follows. If the housing width is too much larger than the distance between the pair of side plates 21 of the lens holder 20, forcible insertion of the lens housing 2 while pressing and spreading the lens holder 20 outward causes a deformation of the lens holder, so that the upper ends of the lens holder 20 are spread out and the distance therebetween is not narrowest any more.

The lens housing 2 is welded at portions 21a, 21b which are in contact with to the pair of side plates 21 of the lens holder 20. The welding is performed by spot welding, and employs YAG laser welding, for example. However, another type of laser welding using carbon dioxide laser or the like may be employed. At the end portions where the distance between the side plates 21 is narrowest, the lens holder 20 is in contact with the lens housing 2 and welded to the lens housing 2. Thus, even if the fabrication accuracy is lowered to some extent, no gap is generated at the weld positions.

Moreover, it is preferable that the positions of the weld portions 21a, 21b be adjusted at the same height as the optical center of the lens 1. When the positions of welds 21a, 21b are adjusted at the same height as the optical center, the alignment of the lens can be performed accurately.

Here, description is provided for assembling of the lens optical component 100. To begin with, the lens housing 2 holding the lens 1 is inserted into the lens holder 20. As illustrated in FIGS. 3A and 3B, this insertion is performed by pushing the lens housing 2 into the lens holder 20 while making the bottom surface of the lens housing 2 facing the support member 22 of the lens holder 20. In this process, the lens housing 2 is pushed into a position where the bottom surface of the lens housing 2 comes into contact with the lens holder 20. Next, the lens 1 of the lens housing 2 is aligned while the lens housing 2 is kept inserted in the lens carrier 20, and the aligned position is stored. After that, the bottom surface of the support member 22 of the lens holder 20 is pressed against and welded to a carrier. Then, in the state where the lens holder 20 is welded to the carrier, the position of the lens 1 is adjusted to the previously stored position by lifting up the lens housing 2. When the adjustment of the lens position is completed, the lens housing 2 and the lens holder 20 are welded to each other.

Here, the lens holder 20 of the lens optical component 100 can be fabricated by wire cut electrical discharge machining. A wire electrical discharge machine achieves highly-accurate and fine machining by: using an extra-fine wire as an electrode, immersing a material to be machined (workpiece) in a working liquid (mainly in a water tank or oil tank), causing a discharge phenomenon between the workpiece and the electrode, and thereby melting and removing the material to be machined.

Figure 6A:
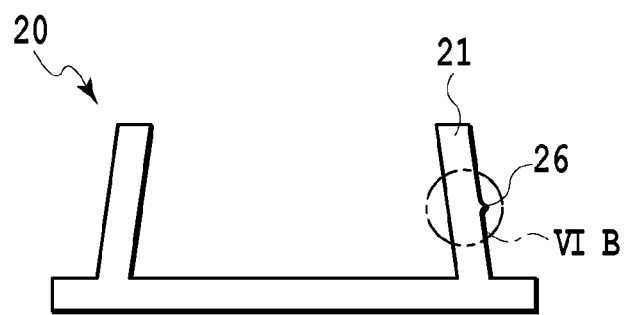
FIG. 6A is a view for explaining wire cut formed in the lens holder.
Figure 6B:
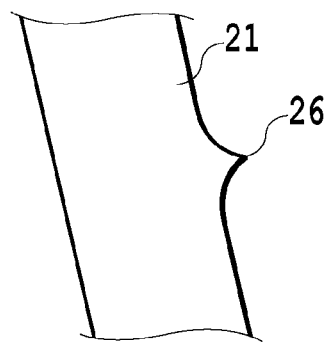
FIG. 6B is a view for explaining wire cut formed in the lens holder.
Figure 6C:
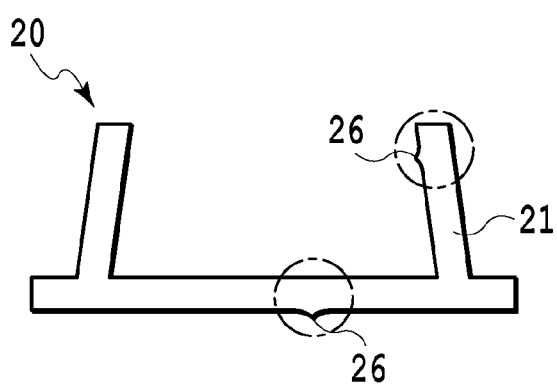
FIG. 6C is a view for explaining wire cut formed in the lens holder.

In the lens optical component 100, the lens holder 20 is fabricated by wire cut electrical discharge machining, and a bump 26 which is formed at a start point or an end point of the wire cutting is located on an outer side surface of one of the side plates 21 (FIG. 6A). At the start point or the end point of the wire cutting, the wire cut electrical discharge machining inevitably forms the bump portion 26 corresponding to the wire diameter on the machined surface (FIG. 6B). The bump 26 has a size of several micrometers to several tens micrometers. If the bump 26 is located on the lower surface of the lens holder or an inner side surface of the side plate 21, a gap is formed between the lens holder 20 and the device carrier or the lens, and acts as a cause for misalignment in welding or a welding error (FIG. 6C). In the lens optical component 100 of the present invention, since the start point or the end point of the wire cutting which is a cause to form the bump 26 is located on the outer side surface of the side plate, and therefore misalignment in welding or a welding error may not occur.

Next, a package equipped with the foregoing lens optical component is described. The package equipped with the lens optical component according to the present invention is equipped with multiple optical components for performing predetermined signal processing, and is equipped with the lens optical component as a unit to establish optical connection between these multiple optical components. Specifically, the package has a structure employing the foregoing lens optical component 100 and illustrated in FIGS. 7A and 7B.

Figure 7A:
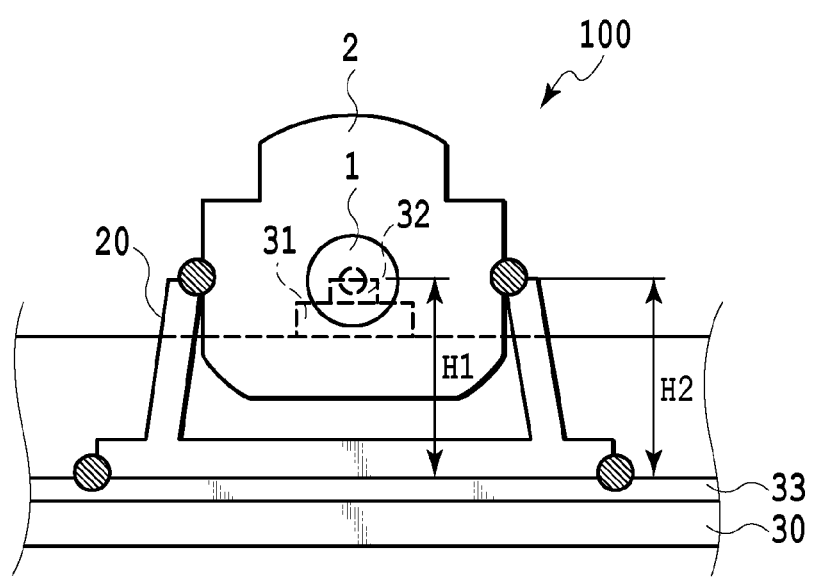
FIG. 7A is a view illustrating a schematic structure of a main part of a package equipped with a lens optical component according to the present invention.
Figure 7B:
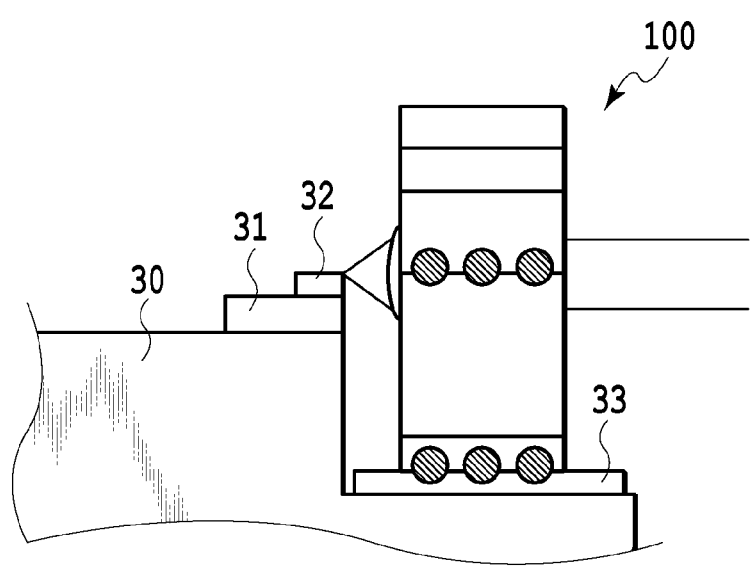
FIG. 7B is a view illustrating a schematic structure of the main part of the package equipped with the lens optical component according to the present invention.

FIGS. 7A and 7B are views illustrating a main part of a package equipped with a lens optical component according to the present invention. The package equipped with the lens optical component includes a lens optical component 100 mounted on a first device carrier 30 with a second device carrier 33 in between, and an optical device 32 mounted on the first device carrier 30 with a heat sink 31 in between, as illustrated in FIGS. 7A and 7B. The optical device 32 is a device to at least perform optical input or optical output, and a laser, a photodiode, an optical waveguide, and the like can be cited as examples of the optical device 32. The heat sink 31 is not necessary depending on a type of the optical device 32, and in this case, the optical device 32 is mounted directly on the first device carrier 30.

The first device carrier 30 may be made of a copper-tungsten alloy which is excellent in heat dissipation. Meanwhile, the second device carrier 33 may be formed of Kovar (a nickel-cobalt ferrous alloy) which is excellent in weldability. The second device carrier 33 is attached to the first device carrier by brazing or soldering.

In the package equipped with the lens optical component according to the present invention, height adjustment with respect to the first device carrier is performed such that a height H2 of the lens holder can be a height H1 that is equal to the position of an input-output portion of the optical device mounted on the first device carrier. The height H2 of the lens holder 20 which is the position targeted at YAG welding is located at the same height as the optical axis, in other words, is located at the center position of the lens. With this structure, stress applied to the lens by welding is evenly applied to an upper portion, a lower portion, a left portion and a right portion of the lens. With such even application of the stress, the refractive index of the lens is equally changed in the upper portion, the lower portion, the left portion and the right portion. Thus, polarization of input-output light can be kept uniform.

Moreover, for the package equipped with the lens optical component according to the present invention, it is desirable to form the lens holder 20 of the lens optical component 100 of a material having the same thermal expansion coefficient as that of the second device carrier 33. A preferable material is Kovar. The lens housing 2 needs to have a thermal expansion coefficient matched with that of the lens 1 made of glass, and therefore inevitably has a thermal expansion coefficient largely different from a semiconductor device such as InP or a device carrier. As a result of repeated fabrications and examinations of experimental samples by the inventors, however, it has been found that an optical device and the aligned position of a lens are not displaced from each other even under a temperature change, if the lens holder 20 is made of a material having the same thermal expansion coefficient as that of the second device carrier 33, in particular, made of Kovar.

REFERENCE SIGNS LIST 1 lens
2 lens housing
100, 15 lens optical component
10, 20, 25 lens holder
11, 21, 23 side plate
12, 22, 24 support section
26 bump
30 first device carrier
33 second device carrier
31 heat sink
32 optical device

The invention claimed is:

1. A lens optical component comprising:
a lens housing holding a lens; and
a lens holder that supports the lens housing holding the lens at a predetermined position, the lens holder comprising:
  a support member that supports the lens holder at a predetermined position; and
  a pair of leg members that are inclined toward the lens housing and extend from the support member to upper end tips, wherein
  the pair of leg members are formed with a distance between the pair of leg members set such that the distance between lower end portions thereof joined to the support member is equal to or larger than a width of the lens housing to be supported and the distance between the upper end tips thereof is set to be equal to or smaller than the width of the lens housing to be supported, and that the distance becomes gradually smaller from the lower end portions to the upper end tips, and wherein
  the upper end tips of the pair of leg members are in contact with the lens housing, and
  the pair of leg members are welded to the lens housing at positions in contact with the lens housing.

2. The lens optical component according to claim 1, wherein a bump formed at a start point or an end point of wire cutting performed in fabricating the lens holder is formed on an outer side surface of any of the leg members.

3. The lens optical component according to claim 1, wherein the positions where the lens housing is welded to the lens holder are located at the same height as an optical center of the lens.

4. The lens optical component according to claim 1, wherein the positions where the lens housing and the leg members are in contact with each other are located at the same height as an optical center of the lens.

5. A package equipped with a lens optical component, comprising:
the lens optical component according to claim 1; and
two or more optical components, wherein
  the lens optical component is inserted in an optical path of the two or more optical components, and
  the height of the lens holder is set to be equal to a height of the input-output portion of an optical device.

6. The package equipped with a lens optical component according to claim 5, wherein
the lens holder of the lens optical component is made of a material having the same thermal expansion coefficient as that of a device carrier on which the lens holder is to be mounted.

7. The lens optical component according to claim 1, wherein the distance between the leg members is smallest at the upper end tips.

8. The lens optical component according to claim 1, wherein the distance between the leg members is smallest where the leg members contact the lens housing.

9. The lens optical component according to claim 1, wherein upper-most ends of the leg members are in contact with and welded to the lens housing.

10. The lens optical component according to claim 1, wherein the lens is positioned within the lens housing.

11. A package, comprising:
two or more optical components, and
a lens optical component inserted in an optical path of the two or more optical components, the lens optical component comprising:
  a lens housing holding a lens; and
  a lens holder supporting the lens housing at a predetermined position, the lens holder comprising:
    a support member supporting the lens holder at a predetermined position; and
    a pair of leg members that are inclined and extend from the support member toward the lens housing, the pair of leg members having a distance therebetween that becomes gradually smaller from lower end portions joined to the support member to upper end portions, the distance between the lower end portions being greater than or equal to a width of the lens housing and the distance between the upper end portions being less than or equal to the width of the lens housing, and wherein
    the upper end portions of the leg members are in contact with the lens housing, and
    the pair of leg members are welded to the lens housing at positions in contact with the lens housing; and
wherein
  the height of the lens holder is set to be equal to a height of an input-output portion of an optical device.

12. The package according to claim 11, further comprising a device carrier on which the lens holder is mounted, the device carrier being comprised of a material having a same thermal expansion coefficient as that of the lens holder.

13. A method of assembling a lens optical component, the method comprising, in the following order:
- inserting a lens housing into a lens holder, the lens housing holding a lens, the lens holder having first and second leg members extending upward from a support member to upper end tips, the distance between the leg members being less at the upper end tips than at the support member, the lens housing being inserted into the lens holder between the leg members;
- adjusting the position of the lens within the lens holder until the lens aligns with a desired optical path and storing the alignment position;
- welding the support member to a carrier;
- vertically adjusting the position of the lens housing with respect to the lens holder to optically align the lens with the stored optical path alignment position;
- welding the upper ends of the lens housing and the lens holder together.

14. The method according to claim 13, wherein vertically adjusting the position of the lens housing is performed by lifting up the lens housing with respect to the lens holder.

* * * * *